(12) United States Patent
Sandhu et al.

(10) Patent No.: US 8,876,536 B2
(45) Date of Patent: Nov. 4, 2014

(54) INTEGRATED CIRCUIT SOCKET SYSTEM WITH CONFIGURABLE STRUCTURES AND METHOD OF MANUFACTURE THEREOF

(75) Inventors: Jaswant Sandhu, Newcastle, WA (US); Robert S. Francis, Redmond, WA (US)

(73) Assignee: Data I/O Corporation, Redmond, WA (US)

( * ) Notice: Subject to any disclaimer, the term of this patent is extended or adjusted under 35 U.S.C. 154(b) by 256 days.

(21) Appl. No.: 13/409,085

(22) Filed: Feb. 29, 2012

(65) Prior Publication Data
US 2013/0224970 A1  Aug. 29, 2013

(51) Int. Cl.
*H01R 12/00* (2006.01)
*H01R 12/71* (2011.01)
*H01R 12/57* (2011.01)
*H01R 12/52* (2011.01)
*H01R 12/50* (2011.01)

(52) U.S. Cl.
CPC .............. *H01R 12/714* (2013.01); *H01R 23/72* (2013.01); *H01R 12/57* (2013.01); *H01R 2201/20* (2013.01); *H01R 12/523* (2013.01)
USPC .......................................................... 439/71

(58) Field of Classification Search
USPC ............................. 439/66, 71, 700, 525, 526
See application file for complete search history.

(56) References Cited

U.S. PATENT DOCUMENTS

| 6,220,870 | B1 | 4/2001 | Barabi et al. |
| 6,541,991 | B1 * | 4/2003 | Hornchek et al. ........ 324/754.07 |
| 6,953,348 | B2 * | 10/2005 | Yanagisawa et al. ........... 439/66 |
| 7,997,907 | B2 * | 8/2011 | Tutt et al. ........................ 439/66 |
| 2009/0163051 | A1 | 6/2009 | Miki |

* cited by examiner

*Primary Examiner* — Neil Abrams
*Assistant Examiner* — Travis Chambers
(74) *Attorney, Agent, or Firm* — Ishimaru & Associates LLP (57) ABSTRACT

A method of manufacture of an integrated circuit socket system includes: forming a retainer plate having a pinhole extending through the retainer plate; forming a base plate having a connector hole extending through the base plate, the connector hole aligned with the pinhole; inserting a compressible pin having a lower probe end through the connector hole and the pinhole below the connector hole, a portion of the compressible pin in the base plate; forming a device plate having a cavity hole extending through the device plate and aligned with the an upper probe end of the compressible pin exposed in the cavity hole; and mounting a removable fastener through the device plate, the base plate, and into the retainer plate, the device plate over the base plate directly on the retainer plate and attached to one another by the removable fastener.

18 Claims, 7 Drawing Sheets

INTEGRATED CIRCUIT SOCKET SYSTEM WITH CONFIGURABLE STRUCTURES AND METHOD OF MANUFACTURE THEREOF

TECHNICAL FIELD

The present invention relates generally to an integrated circuit socket system, and more particularly to a system with modular structures.

BACKGROUND ART

Electronic products such as cell phone base products, global positioning systems (GPS), satellites, communication equipment, consumer products, and a vast line of other similar products are in ever increasing global demand. It is very important for products to continue to improve in features, performance, quality, customer satisfaction, and reliability while reducing product costs, product size, and to be available quickly for purchase by the consumers or buyers.

Packaged integrated circuit devices, also known semiconductor devices, used in the electronic products must be capable of competing in world markets and attracting many consumers or buyers. The consumers or buyers seek assurances that the semiconductor devices and products with the semiconductor devices will perform according to manufacturer's specifications and expectations under real operating conditions.

Market growths for the semiconductor devices that are highly reliable and free of any defects are crucial to manufacturers of the products. The semiconductor devices are constantly improved upon resulting in changes to sizes, shapes, connector types, and connector placement of the semiconductor devices.

The changes to the semiconductor devices force the manufacturers of the semiconductor devices to modify, at a moment notice, sockets and systems used to mount, connect, control, and assess the semiconductor devices. It is extremely important that the speed and cost of changing and re-tooling the systems be efficient for the manufacturer of the semiconductor devices, product users of the semiconductor devices, and the consumer of the end product.

Thus, an increasing need remains to increase the ability to quickly and efficiently leverage, re-tool, or provide sockets or systems used to mount, connect, control, and assess the semiconductor devices. It is also critical the sockets or the systems provide a balanced solution covering all aspects of currently available and future semiconductor devices including factors due to differences in performance, size, complexity, costs, and output flow of the semiconductor devices. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit socket system including: forming a retainer plate having a pinhole extending through the retainer plate; forming a base plate having a connector hole extending through the base plate, the connector hole aligned with the pinhole; inserting a compressible pin having a lower probe end through the connector hole and the pinhole below the connector hole, a portion of the compressible pin in the base plate; forming a device plate having a cavity hole extending through the device plate and aligned with the an upper probe end of the compressible pin exposed in the cavity hole; and mounting a removable fastener through the device plate, the base plate, and into the retainer plate, the device plate over the base plate directly on the retainer plate and attached to one another by the removable fastener.

The present invention provides an integrated circuit socket system, including: a retainer plate having a pinhole extending through the retainer plate; a base plate having a connector hole extending through the base plate, the connector hole aligned with the pinhole; a compressible pin having a lower probe end through the connector hole and the pinhole below the connector hole, a portion of the compressible pin in the base plate; a device plate having a cavity hole extending through the device plate and aligned with the an upper probe end of the compressible pin exposed in the cavity hole; and a removable fastener through the device plate, the base plate, and into the retainer plate, the device plate over the base plate directly on the retainer plate and attached to one another by the removable fastener.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views shown in the drawings shown for ease of description and generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane formed parallel to another plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes development, etching, cleaning, heating, cooling, testing, characterizing, assembling, and/or removal of the material as required in forming a described structure or component.

Figure 1:
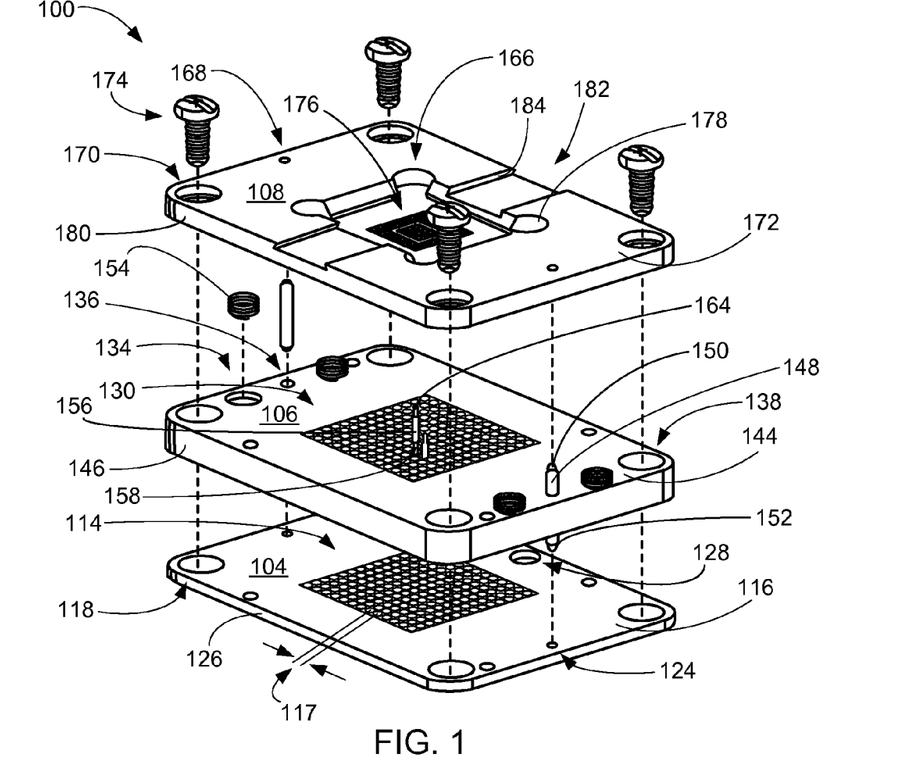
FIG. 1 is an isometric exploded view of an integrated circuit socket system in a first embodiment of the present invention.

Referring now to FIG. 1, therein is shown an isometric exploded view of an integrated circuit socket system 100 in a first embodiment of the present invention. The integrated circuit socket system 100 includes a retainer plate 104, a base plate 106, and a device plate 108.

The retainer plate 104 can be formed of a rigid insulative material having selected thermal, mechanical, electrical, and chemical characteristics. The retainer plate 104 can include pinholes 114 that are orthogonal to an upper retainer surface 116 of the retainer plate 104 and extend through the retainer plate 104. The upper retainer surface 116 is a planar surface.

A pinhole pitch 117 is defined as a horizontal separation distance between a central axis of one of the pinholes 114 to another central axis of another of the pinholes 114 abutted to and separated by a common portion of the rigid material of the retainer plate 104 and no other of the pinholes 114 in between. The pinholes 114 can be formed having the pinhole pitch 117 pre-determined and pre-determined cross-sectional area.

The pinhole pitch 117, for example, can be pre-determined to be two tenths of a millimeter, four tenths of a millimeter, five tenths of a millimeter, seventy-five hundreds of a millimeter, one millimeter, one hundred and twenty-seven thousandths of a centimeter, or of any customized pitch specified by the user. The pre-determined cross-sectional area of the pinholes 114 can be selected and based on the pinhole pitch 117.

For illustrative purposes, the pinholes 114 are all shown patterned within a region having an outlined shape of a rectangle. The pinholes 114 can be formed and patterned within a region having a combination of different outlined shapes or sizes. For example, the retainer plate 104 could have been formed with a region with a portion of the region having an outlined shape of a square and another portion of the region having an outlined shape of a circle.

Also for illustrative purposes, the pinholes 114 are shown formed distributed uniformly within the region. The pinholes 114 within any region can be distributed differently within the region. For example, some of the pinholes 114 could be grouped together having an offset from a center of the region and other of the pinholes 114 can be grouped together having an offset from the center of the region and away from the some of the pinholes 114.

Retainer holes 118 and bottom alignment holes 124 are formed in the retainer plate 104 from the upper retainer surface 116 along and next to retainer plate edges 126 of the retainer plate 104. The retainer holes 118, formed at corners of the retainer plate 104, extend through the retainer plate 104 and can optionally be internally threaded (not shown). The bottom alignment holes 124 can extend through the retainer plate 104.

The bottom alignment holes 124 can be used to vertically align the retainer plate 104 within the integrated circuit socket system 100. The bottom alignment holes 124 can also be used to retain or align the retainer plate 104 to machinery (not shown) during phases of manufacturing and forming of the retainer plate 104. The retainer plate edges 126 are non-horizontal and form a peripheral outlined shape of the retainer plate 104.

For illustrative purposes, the peripheral outlined shape of the retainer plate 104 is shown having a shape of a rectangle with curved shaped corners. It is understood that the peripheral outlined shape of the retainer plate 104 can have any geometric shape with any geometric shaped corners. For example, the retainer plate 104 could have a shape of a square with right-angled corners.

The retainer plate edges 126 are exposed from the integrated circuit socket system 100 and are exposed from the integrated circuit socket system 100. The curved corners of the retainer plate 104 are also exposed from the integrated circuit socket system 100.

The retainer plate 104 can optionally include a pressure port 128, such as an opening, an orifice, a hole, or combination thereof, formed through the retainer plate 104. The pressure port 128 provides a capability to clear out debris or contaminants from within or around the integrated circuit socket system 100. A gas or fluid, such as air, a non-reactive evaporative solvent, a non-reactive gas, an inert gas or a noble gas, can be used to apply a positive pressure into the pressure port 128 to clear out any debris or contaminants inside or around the retainer plate 104, the base plate 106, and the device plate 108. The pressure port 128 can be located along and next to any of the retainer plate edges 126.

For illustrative purposes, the base plate 106 is shown without a base port for clearing out debris or contaminants from within or around the integrated circuit socket system 100, it is understood that the base plate 106 can optionally include the base plate. A gas or fluid, such as air, a non-reactive evaporative solvent, a non-reactive gas, an inert gas or a noble gas, can be used to apply a positive pressure into the base port to clear out any debris or contaminants inside or around the retainer plate 104, the base plate 106, and the device plate 108. Negative pressure, such as a vacuum source, can be used to clear out any debris or contaminants inside or around the retainer plate 104, the base plate 106, and the device plate 108 in a manner similar to the usage of positive pressure.

The base port can be formed in a manner similar to the pressure port 128. For example, the base port can be formed through the base plate 106 in a manner similar to the pressure port 128 formed through the retainer plate 104. Also for example, the base port can be directly over the pressure port 128.

The retainer plate 104 with the retainer plate edges 126, the retainer holes 118, the pinholes 114, the pressure port 128, and the bottom alignment holes 124, can be formed using a material stock by a removal process, a molding process, or a combination thereof. The material stock removal process can include drilling, etching, laser bombardment, sanding, polishing, or any process providing removal of material. The molding process can include an injection, thermoforming, blow, compression, gas assist, transfer, lamination, vacuum plug assist, or pressure plug assist, or combination thereof.

The base plate 106 is mounted directly over and on to the upper retainer surface 116. The base plate 106 can be formed from the rigid insulative material of the retainer plate 104 or of a material similar to the rigid insulative material and having any thermal, mechanical, electrical, and chemical characteristics.

The base plate 106 includes connector holes 130, retention cavities 134, post holes 136, and base holes 138. The base holes 138 can be formed, sized, and positioned in the base plate 106 in a manner similar to the retainer holes 118. The base holes 138 are centered over the retainer holes 118.

The connector holes 130 extend through an upper base surface 144 of the base plate 106 and the base plate 106. The connector holes 130 can each be centered over one of the pinholes 114 of the retainer plate 104.

The upper base surface 144 is planar. A number of the retention cavities 134 can be located in the base plate 106, along, and next to at least two base plate edges 146 of the base plate 106 that are opposite and facing away from one another.

The base plate edges 146 are non-horizontal and can form a peripheral outlined shape of the base plate 106. The peripheral outlined shape of the base plate 106 can be substantially the same as the peripheral outlined shape of the retainer plate 104.

The post holes 136 can be formed through the base plate 106. The post holes 136 are positioned between each of the number of the retention cavities 134 in the upper base surface 144 and can be along and adjacent the base plate edges 146. Each of the post holes 136 are directly over one of the bottom alignment holes 124 of the retainer plate 104.

Post connectors 148 formed from an inflexible material and have a cross-sectional area less than a cross-section of the post holes 136 can be inserted in the post holes 136 of the base plate 106. Lower ends 152 of each of the post connectors 148 can protrude through the post holes 136 and extend into the bottom alignment holes 124 of the retainer plate 104.

An end of compressible supports 154 resistant to permanent deformation, such as springs, coiled wire, helix wire, or combination thereof, and smaller than a cross-sectional area of the retention cavities 134 can be inserted into each of the retention cavities 134. Another end of the compressible supports 154, opposite the end of the compressible supports 154 protrudes above the upper base surface 144.

Compressible pins 156 resilient and resistant to permanent deformation, such as pogo pins, H-Pin technology pogo pins, spring probes, or spring needles, are formed from an electrically conductive material. The compressible pins 156 can be inserted into each of the connector holes 130. The compressible pins 156 include lower probe ends 158 and upper probe ends 164 opposite the lower probe ends 158.

Vertical forces applied towards the lower probe ends 158 or the upper probe ends 164 can reduce lengths of the compressible pins 156. Removal of the vertical forces will result in the lower probe ends 158 or the upper probe ends 164 to project away from one another and restore the lengths of the compressible pins 156.

The lower probe ends 158 can vertically protrude below the base plate 106 and through the retainer plate 104. The upper probe ends 164 can protrude vertically above the base plate 106 or can be coplanar with the upper base surface 144. Sides of the compressible pins 156 between the lower probe ends 158 and the upper probe ends 164 can optionally include interference fit characteristic features, such as tapers, ridges, steps, or similar interlocking side features.

The interference fit characteristic features can limit vertical movement of the compressible pins 156 within the base plate 106. The interference fit characteristic features enables the upper probe ends 164 and the lower probe ends 158 to retract and protrude freely while the compressible pins 156 are inserted into the connector holes 130.

The device plate 108 is mounted directly over the base plate 106. The device plate 108 can be formed from the material of the base plate 106 or of a material similar to the material of the base plate 106 and having any thermal, mechanical, electrical, and chemical characteristics specific to an end users requirements.

The device plate 108 includes device cavity 166, top alignment holes 168, top holes 170, and an upper device surface 172 that is planar. The top holes 170 can be formed, sized, and positioned in the upper device surface 172 in a manner similar to the retainer holes 118.

The top holes 170 are centered over the retainer holes 118. The top holes 170 can optionally include an enlarged end, such as a bevel, a counter sink, a chamfer, or similar enlarged hole, to permit a flush mounting of removable fasteners 174, such as and not limited to screws, bolts, or nuts on stud.

The device cavity 166 is formed in through the upper device surface 172 into a portion of the device plate 108 and directly over an area of the base plate 106 having the connector holes 130. Cavity holes 176 are formed in the device cavity 166 and are each vertically aligned with the upper probe ends 164. The cavity holes 176 extend from the device cavity 166 through the device plate 108. Each of the upper probe ends 164 can be visibly exposed and recessed in each of the cavity holes 176.

The cavity holes 176 enable electrical interconnects (not shown) of an integrated circuit device (not shown) to be inserted into the cavity holes 176 with both the integrated circuit device seated in the device cavity 166 and the electrical interconnects in direct contact with the upper probe ends 164. The electrical interconnects provide electrical connectivity between the integrated circuit device, such as an integrated circuit module, an integrated circuit package, or an integrated circuit component, and the compressible pins 156 of the integrated circuit socket system 100.

Perimeter sides 178 of the device cavity 166 can be beveled, flat, curved, or a combination thereof. The perimeter sides 178 form an obtuse angle relative to the upper device surface 172 and surround the integrated circuit device.

The top alignment holes 168 can be formed, sized, and positioned in the upper device surface 172 in a manner similar to the bottom alignment holes 124. Upper ends 150 of the post connectors 148 opposite from the lower ends 152 can be partially inserted into the top alignment holes 168 of the device plate 108 to vertically align the base plate edges 146 with device plate edges 180 of the device plate 108.

The device plate edges 180 are non-horizontal and can form a peripheral outlined shape of the device plate 108. The peripheral outlined shape of the device plate 108 can be substantially the same as the peripheral outlined shape of the base plate 106.

The removable fasteners 174 are inserted through the top holes 170, through the base holes 138, and into the retainer holes 118. The removable fasteners 174 attach and clamp the retainer plate 104 below and in direct contact with the base plate 106 and attach the device plate 108 over the base plate 106. Threads of the removable fasteners 174 can be mated with the retainer holes 118.

The compressible supports 154 are inserted or placed between the device plate 108 and the upper base surface 144 of the base plate 106 and can be partially compressed. The device plate 108 can optionally include a module retention channel 182 formed in the device plate 108 from one of the device plate edges 180 to another of the device plate edges 180 opposite the one of the device plate edges 180. The module retention channel 182 between the one of the device plate edges 180 and the another of the device plate edges 180 is intersected and divided by the device cavity 166.

The module retention channel 182 is formed having parallel facing non-vertical sides 184 that extend from one of the device plate edges 180 to the another of the device plate edges 180. The non-vertical sides 184 can intersect opposing peripheral sides of the device cavity 166.

The retainer plate edges 126 of the retainer plate 104, the base plate edges 146 of the base plate 106, and the device plate edges 180 of the device plate 108 can be marked using edge identifiers (not shown) such as marks that can include symbols, tints, coatings, letters, bar codes, or other finishes formed by etching, plating, painting, embossing, stamping, or other surface treatments.

It has been discovered that the removable fasteners 174, the compressible supports 154, the retainer plate 104, the base plate 106, the device plate 108, the post connectors 148, or a combination thereof, can be made and delivered according to customer specifications within days, as opposed to over six weeks, to decrease ramp-up or turn around times for manufacturing, testing, or development of integrated circuit device products.

It has been discovered that the compressible pins 156 in combination with the pinholes 114, the removable fasteners 174, the connector holes 130, and the cavity holes 176 provide improved strength, alignment, and mechanical tolerances resulting in better reliability, or mean time before failure of the retainer plate 104, the base plate 106, and the device plate 108, respectively.

It has been discovered that the removable fasteners 174, the retainer plate 104, the base plate 106, or the device plate 108 can be individually customized to provide for a mix and match component system solution that permits full or partial customizable integrated circuit socket systems compatible with different integrated circuit devices including the electrical interconnects of the different integrated circuit devices.

It has been discovered that by the retainer plate 104, the base plate 106, or the device plate 108 can be swapped with another retainer plate, another base plate, or another device plate to accommodate customized integrated circuit packages without the need for a new board or a new socket assembly replacement.

It has been discovered that the post connectors 148, the top alignment holes 168, the post holes 136, and the bottom alignment holes 124 provide precise alignment and resistance to rotational movement of the retainer plate 104, the base plate 106, or the device plate 108 and can have the pinhole pitch 117 sized between two tenths of a millimeter to one hundred and twenty-seven thousandths of a centimeter.

It has been discovered that the upper ends 150 and the lower ends 152 of the post connectors 148 align and restrict movement between the base plate 106, the retainer plate 104, and the device plate 108 to provide alignment tolerances for the compressible pins 156 and electrical interconnects of an integrated circuit module that are equal to or better than any integrally formed non-serviceable integrated circuit socket.

It has been discovered that applying positive pressure through the pressure port 128 of the retainer plate 104 removes contaminants or debris before insertion of the integrated circuit module to improve electrical characteristics and reliability between the integrated circuit socket system and the integrated circuit module.

It has been discovered that applying negative pressure through the pressure port 128 of the retainer plate 104 pulls and holds the an integrated circuit module in the device cavity 166 to improve electrical characteristics and reliability between the integrated circuit socket system and the integrated circuit module.

It has been discovered that the removable fasteners 174, the compressible supports 154, the retainer plate 104, the base plate 106, the device plate 108, and the post connectors 148 combined with the compressible pins 156 having a rated lifespan of over one quarter million insertion/compression cycle and results in the integrated circuit socket system 100 having a minimum lifespan exceeding one quarter million insertion/removals of an integrated circuit module.

It has been unexpectedly found that the perimeter sides 178 formed at an obtuse angle relative to the upper device surface 172 enable improved automated insertion or removal of integrated circuit modules in to or out of the device cavity 166 for increased hourly unit test throughput.

It has been unexpectedly found that the compressible pins 156 in combination with the pinholes 114, the connector holes 130, and the cavity holes 176 can provide for over two hundred and fifty thousand insertion cycles resulting in a substantially long socket life.

Figure 2:
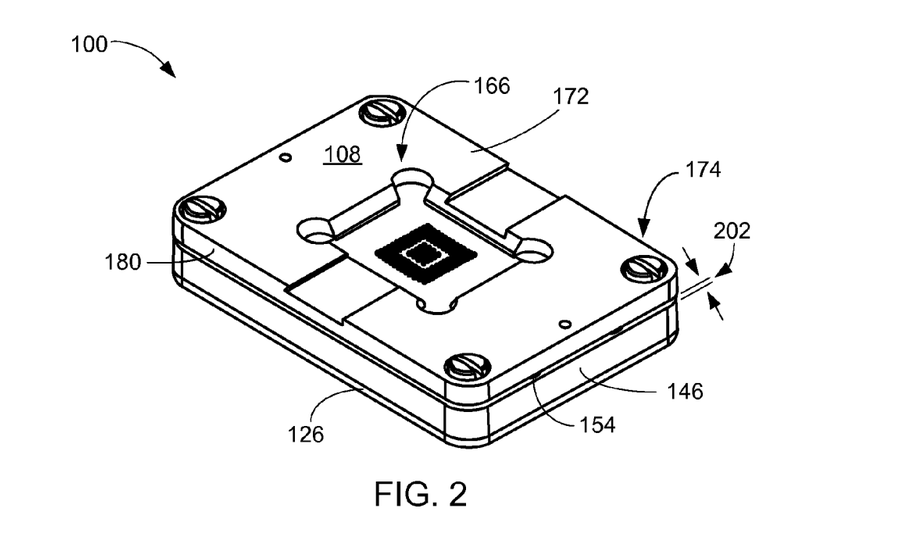
FIG. 2 is an isometric view of the integrated circuit socket system of FIG. 1.

Referring now to FIG. 2, therein is shown an isometric view of the integrated circuit socket system 100 of FIG. 1. Shown are the removable fasteners 174 attaching and clamping the upper retainer surface 116 of FIG. 1 below and in direct contact with the base plate 106 of FIG. 1 below the device plate 108. Visible are the retainer plate edges 126 of the retainer plate 104 of FIG. 1, the base plate edges 146 of the base plate 106, and the device plate edges 180 of the device plate 108.

For illustrative purposes, the base plate 106 is shown over and separated from the device plate 108. It is understood that the base plate 106 can be in direct contact with or separated from directly contacting the device plate 108. For example, pre-determined combinational lengths of the compressible supports 154, the post connectors 148 of FIG. 1, and the compressible pins 156 of FIG. 1 can be selected to enable the removable fasteners 174 to clamp the base plate 106 directly on to and in contact to the device plate 108.

The pre-determined combinational lengths can be determined by user requirements, compatibility with pre-existing parts in use by the user, or dimensional characteristics of the electrical interconnects specific to the integrated circuit device previously identified by the user. Also parameters such as pressure, temperature, or humidity that the integrated circuit socket system is to be exposed to, or a combination thereof, can be used in determining the pre-determined combinational lengths.

The device plate 108 is separated from the base plate 106 by a compressible gap 202 exposing a portion of the compressible supports 154 between the base plate edges 146 and the device plate edges 180. The portion of the compressible supports 154 can be exposed in the compressible gap 202 between one of the base plate edges 146 and one of the device plate edges 180.

The compressible supports 154 can be partially compressed to mount the device plate 108 over the upper base surface 144 of FIG. 1 of the base plate 106. The compressible supports 154 can be used to form the compressible gap 202 between the device plate 108 and the upper base surface 144 or can optionally be compressed to mount the device plate 108 directly on to the upper base surface 144.

The compressible gap 202 can be momentarily reduced to enable the device plate 108 to contact the upper base surface 144 by further compressing the compressible supports 154 and the compressible pins 156 while seating the integrated circuit device with the electrical interconnects into the device cavity 166. Once the integrated circuit device is seated in the device cavity 166, the compressible supports 154 restore the compressible gap 202 while maintaining direct contact between the electrical interconnects and the compressible pins 156.

In a process of removing the integrated circuit device, the upper device surface 172 surrounding the device cavity 166 can be depressed and de-compressing forces applied to the electrical interconnects by expansion of the compressible pins 156 can provide a vertical force to assist in the separation of the integrated circuit device from the device plate 108.

It has been discovered that the compressible gap 202 provided by the compressible supports provide assistance in removal of an integrated circuit device to simplify automated test or manufacturing processing.

It has been discovered that the compressible gap 202 provided by the compressible supports eliminates any damage, including as bent, misaligned, or broken pins, to the electrical interconnects of an integrated circuit device as a result of removal of the integrated circuit device from the present invention.

It has been discovered that use of the edge identifiers on the device plate edges 180, the retainer plate edges 126, or the base plate edges 146 provides immediate visual identification of the version, configuration combination, and the integrated circuit socket system to improve re-tooling turn overs, manufacturing downtime, inventory logging, or parts ordering for the integrated circuit socket system It has been discovered that use of the edge identifiers on the compressible supports 154 identifies compressibility strength and size of the compressible supports 154 to minimize re-tooling time and to quickly locate, inventory, catalog, or identify replacement.

Figure 3:
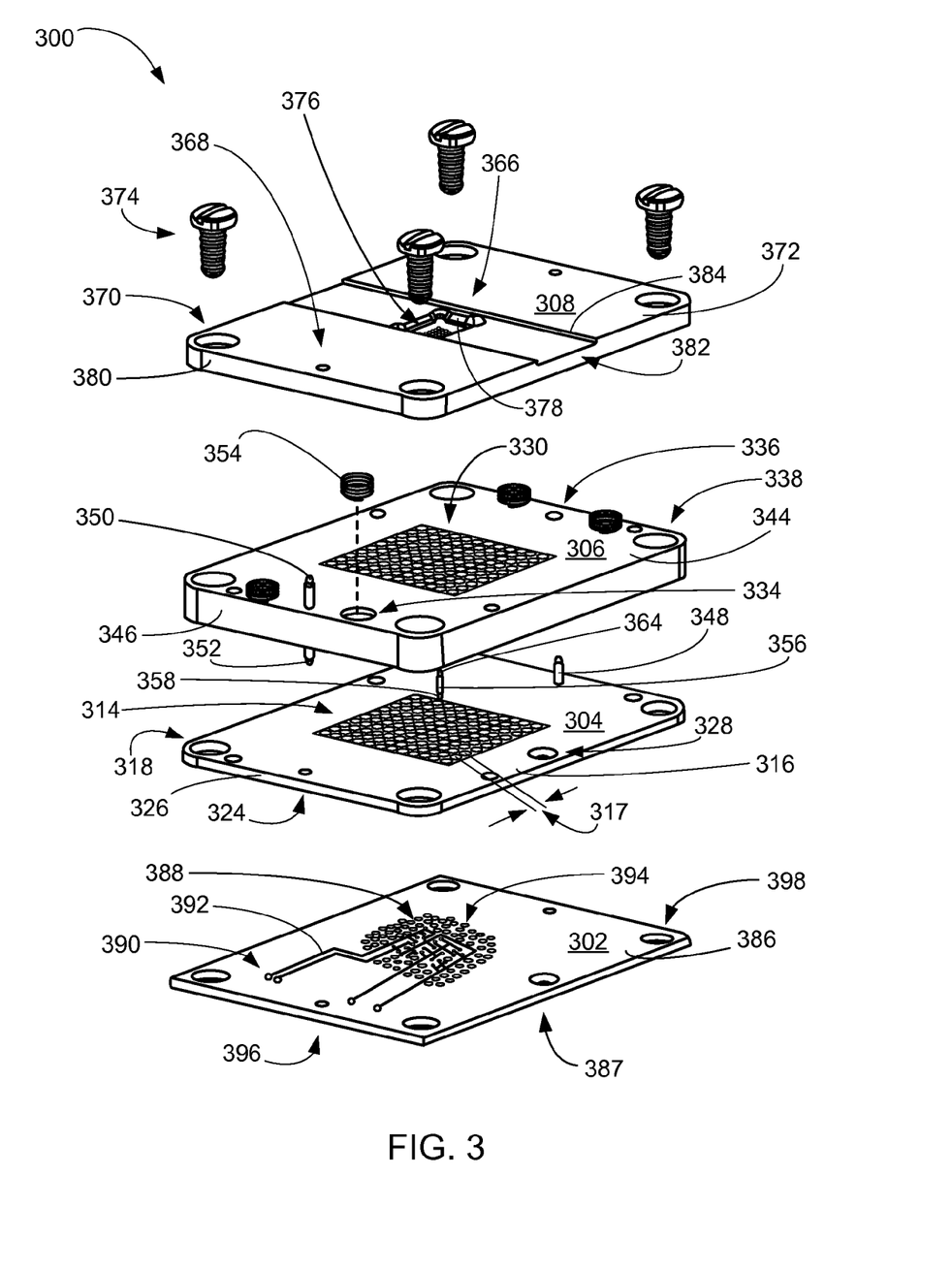
FIG. 3 is an isometric exploded view of an integrated circuit socket system in a second embodiment of the present invention.

Referring now to FIG. 3, therein is shown an isometric exploded view of an integrated circuit socket system 300 in a second embodiment of the present invention. The integrated circuit socket system 300 includes a router connection panel 302, a retainer plate 304, a base plate 306, and a device plate 308.

The retainer plate 304 can be formed of a rigid insulative material having selected thermal, mechanical, electrical, and chemical characteristics specific to an end users requirements. The retainer plate 304 can include pinholes 314 that are orthogonal to an upper retainer surface 316 of the retainer plate 304 and extend through the retainer plate 304. The upper retainer surface 316 is a planar surface.

A pinhole pitch 317 can be defined as a horizontal separation distance between a central axis of one of the pinholes 314 to another central axis of another of the pinholes 314 abutted to and separated by a common portion of the rigid material of the retainer plate 304 and no other of the pinholes 314 in between. The pinholes 314 can be formed having the pinhole pitch 317 pre-determined and pre-determined cross-sectional area.

The pinhole pitch 317 can be pre-determined to be two tenths of a millimeter, four tenths of a millimeter, five tenths of a millimeter, seventy five hundreds of a millimeter, one millimeter, one hundred and twenty-seven thousandths of a centimeter, or of any customized pitch specified by the user. The pre-determined cross-sectional area can be selected and based on the pinhole pitch 317.

For illustrative purposes, the pinholes 314 are all shown patterned within a region having an outlined shape of a rectangle. The pinholes 314 can be formed and patterned within a region having a combination of different outlined shapes or sizes. For example, the retainer plate 304 could have been formed with a region with a portion of the region having an outlined shape of a square and another portion of the region having an outlined shape of a circle.

Also for illustrative purposes, the pinholes 314 are shown formed distributed uniformly within the region. The pinholes 314 within any region can be distributed differently within the region. For example, some of the pinholes 314 could be grouped together having an offset from a center of the region and other of the pinholes 314 can be grouped together having an offset from the center of the region and away from the some of the pinholes 314.

Retainer holes 318 and bottom alignment holes 324 are formed in the upper retainer surface 316 along and next to retainer plate edges 326 of the retainer plate 304. The retainer holes 318, formed at corners of the retainer plate 304, extend through the retainer plate 304 and can optionally be internally threaded (not shown). The bottom alignment holes 324 can extend through the retainer plate 304.

The bottom alignment holes 324 can be used to vertically align the retainer plate 304 within the integrated circuit socket system 300. The bottom alignment holes 324 can also be used to retain or align the retainer plate 304 to machinery (not shown) during phases of manufacturing and forming of the retainer plate 304. The retainer plate edges 326 are non-horizontal and form a peripheral outlined shape of the retainer plate 304.

For illustrative purposes, the peripheral outlined shape of the retainer plate 304 is shown having a shape of a rectangle with curved shaped corners. It is understood that the peripheral outlined shape of the retainer plate 304 can have any geometric shape with any geometric shaped corners. For example, the retainer plate 304 could have a shape of a square with right angled corners.

The retainer plate edges 326 are exposed from the integrated circuit socket system 300 and are exposed from the integrated circuit socket system 300. The curved corners of the retainer plate 304 are also exposed from the integrated circuit socket system 300.

The retainer plate 304 can optionally include a pressure port 328, such as an opening, an orifice, a hole, or combination thereof, formed through the retainer plate 304. A gas or fluid, such as air, a non-reactive evaporative solvent, a non-reactive gas, an inert gas or a noble gas, can be used to apply a positive pressure into the pressure port 328 to clear out any debris or contaminants inside or around the retainer plate 304, the base plate 306, and the device plate 308. The pressure port 328 can be located along and next to any of the retainer plate edges 326. Negative pressure, such as a vacuum source, can be used to clear out any debris or contaminants inside or around the retainer plate 304, the base plate 306, and the device plate 308 in a manner similar to the usage of positive pressure.

The retainer plate 304 with the retainer plate edges 326, the retainer holes 318, the pinholes 314, the pressure port 328, and the bottom alignment holes 324, can be formed using a material stock by a removal process, a molding process, or a combination thereof. The material stock removal process can include drilling, etching, laser bombardment, sanding, polishing, or any process providing removal of material. The molding process can include an injection, thermoforming, blow, compression, gas assist, transfer, lamination, vacuum plug assist, or pressure plug assist, or combination thereof.

The base plate 306 is mounted directly over and on to the upper retainer surface 316. The base plate 306 can be formed from the rigid insulative material of the retainer plate 304 or of a material similar to the rigid insulative material and having any thermal, mechanical, electrical, and chemical characteristics specific to an end users requirements.

The base plate 306 includes connector holes 330, retention cavities 334, post holes 336, and base holes 338. The base holes 338 can be formed, sized, and positioned in the base plate 306 in a manner similar to the retainer holes 318. The base holes 338 are centered over the retainer holes 318.

The connector holes 330 extend through an upper base surface 344 of the base plate 306 and the base plate 306. The connector holes 330 can each be centered over one of the pinholes 314 of the retainer plate 304. The upper base surface 344 is planar is parallel with the upper retainer surface 316.

A number of the retention cavities 334 can be located in the base plate 306, along, and next to at least two base plate edges 346 of the base plate 306 that are opposite and facing away from one another.

The base plate edges 346 are non-horizontal and can form a peripheral outlined shape of the base plate 306. The peripheral outlined shape of the base plate 306 can be substantially the same as the peripheral outlined shape of the retainer plate 304.

The post holes 336 can be formed through the base plate 306. The post holes 336 are positioned between each of the number of the retention cavities 334 in the upper base surface 344 and can be along and adjacent the base plate edges 346. Each of the post holes 336 are directly over one of the bottom alignment holes 324 of the retainer plate 304.

Post connectors 348 formed from an inflexible material and having a cross-sectional area less than a cross-section of the post holes 336 can be inserted in the post holes 336 of the base plate 306. Lower ends 352 of each of the post connectors 348 can protrude through the post holes 336 and extend into the bottom alignment holes 324 of the retainer plate 104.

An end of compressible supports 354 resistant to permanent deformation, such as springs, coiled wire, helix wire, or combination thereof, and smaller than a cross-sectional area of the retention cavities 334 can be inserted into each of the retention cavities 334. Another end of the compressible supports 354, opposite the end of the compressible supports 354 protrudes above the upper base surface 344.

Compressible pins 356 resilient and resistant to permanent deformation, such as pogo pins, H-Pin technology pogo pins, spring probes, contact pins, or spring needles, are formed from an electrically conductive material. The compressible pins 356 can be inserted into each of the connector holes 330. The compressible pins 356 include lower probe ends 358 and upper probe ends 364 opposite the lower probe ends 358.

Vertical forces applied to the lower probe ends 358 or the upper probe ends 364 reduce total lengths of the compressible pins 356. Removal of the vertical forces will result in the lower probe ends 358 or the upper probe ends 364 to project away from one another and restore the total lengths of the compressible pins 356.

The lower probe ends 358 can vertically protrude below the base plate 306 and through the retainer plate 304. The upper probe ends 364 can protrude vertically above the base plate 306 or can be coplanar with the upper base surface 344. Sides of the compressible pins 356 between the lower probe ends 358 and the upper probe ends 364 can optionally include interference fit characteristic features, such as tapers, ridges, steps, or similar interlocking side features.

The interference fit characteristic features can limit vertical movement of the compressible pins 356 within the base plate 306. The interference fit characteristic features would enable the upper probe ends 364 and the lower probe ends 358 to retract and protrude freely while the compressible pins 356 are inserted into the connector holes 330.

The device plate 308 is mounted directly over the base plate 306. The device plate 308 can be formed from the material of the base plate 306 or of a material similar to the material of the base plate 306 and having any thermal, mechanical, electrical, and chemical characteristics specific to an end users requirements.

The device plate 308 includes device cavity 366, top alignment holes 368, top holes 370, and an upper device surface 372 that is planar. The top holes 370 can be formed, sized, and positioned in the upper device surface 372 in a manner similar to the retainer holes 318.

The top holes 370 are centered over the retainer holes 318. The top holes 370 can optionally include an enlarged end, such as a bevel, a counter sink, a chamfer, or similar enlarged hole, to permit a flush mounting of removable fasteners 374, such as and not limited to screws, bolts, or nuts on stud.

The device cavity 366 is formed in and through the upper device surface 372 into a portion of the device plate 308 and directly over an area of the base plate 306 having the connector holes 330. Cavity holes 376 are formed in the device cavity 366 and are each vertically aligned with the upper probe ends 364. The cavity holes 376 extend from the device cavity 366 through the device plate 308. Each of the upper probe ends 364 can be visibly exposed and recessed in each of the cavity holes 376.

The cavity holes 376 enable electrical interconnects (not shown) of an integrated circuit device (not shown) to be inserted into the cavity holes 376 and directly contact the upper probe ends 364. The electrical interconnects provide electrical connectivity between the integrated circuit device and the compressible pins 356 of the integrated circuit socket system 300.

Perimeter sides 378 of the device cavity 366 can be beveled, flat, curved, or a combination thereof. The perimeter sides 378 form an obtuse angle relative to the upper device surface 372 and surround the integrated circuit device.

The top alignment holes 368 can be formed, sized, and positioned in the upper device surface 372 in a manner similar to the bottom alignment holes 324. Upper ends 350 of the post connectors 348 opposite from the lower ends 352 can be partially inserted into the top alignment holes 368 of the device plate 308 to vertically align the base plate edges 346 with device plate edges 380 of the device plate 308.

The device plate edges 380 are non-horizontal and can form a peripheral outlined shape of the device plate 308. The peripheral outlined shape of the device plate 308 can be substantially the same as the peripheral outlined shape of the base plate 306.

The removable fasteners 374 are inserted through the top holes 370, through the base holes 338, and into the retainer holes 318. The removable fasteners 374 attach and clamp the retainer plate 304 below and in direct contact with the base plate 306 and with the device plate 308 over the base plate 306.

The compressible supports 354 are inserted or placed between the device plate 308 and the upper base surface 344 of the base plate 306 and can be partially compressed to mount the device plate 308 over the upper base surface 344. The compressible supports 354 can be used to form the compressible gap 202 of FIG. 2 of the integrated circuit socket system 100 of FIG. 2 between the device plate 308 and the upper base surface 344 or can optionally be compressed to mount the device plate 308 directly on to the upper base surface 344.

The compressible gap 202 can be momentarily reduced to enable the device plate 308 to contact the upper base surface 344 by further compressing the compressible supports 354 and the compressible pins 356 while seating the integrated circuit device with the electrical interconnects into the device cavity 366. Once the integrated circuit device is seated in the device cavity 366, the compressible supports 354 restore the compressible gap 202 while maintaining direct contact between the electrical interconnects and the compressible pins 356.

In a process of removing the integrated circuit device, the upper device surface 372 surrounding the device cavity 366 can be depressed and de-compressing forces applied to the electrical interconnects by expansion of the compressible pins 356 can provide a vertical force to assist in the separation of the integrated circuit device from the device plate 308.

The device plate 308 can optionally include a module retention channel 382 formed from one of the device plate edges 380 to another of the device plate edges 380 opposite the one of the device plate edges 380. The module retention channel 382 between the one of the device plate edges 380 and the another of the device plate edges 380 is intersected and divided by the device cavity 366.

The module retention channel 382 is formed having parallel and facing non-vertical sides 384 that extend from one of the device plate edges 380 to the another of the device plate edges 380 opposite the one of the device plate edges 380. The non-vertical sides 384 can intersect opposing peripheral sides of the device cavity 366.

The router connection panel 302 is optional. The router connection panel 302 provides additional connections to simplify or increase signal connectivity between the integrated circuit socket system 300 and a next level of integration (not shown) such as a board, a printed circuit board, board adapter, or any electronic equipment or product.

The router connection panel 302 can be machined to order or formed from an insulated panel material or common raw parts. The insulated panel material can include electrical conductors distributed on an interior side 386 of the router connection panel 302, layered and isolated from one another between the interior side 386 and an exterior side (not shown) of the router connection panel 302 opposite the interior side 386, or exposed from the exterior side.

An access port 387 can be formed through the router connection panel 302 vertically aligned with the pressure port 328 of the retainer plate 304. The access port 387 enables gas or fluid to enter or exit the pressure port 328 of the retainer plate 304.

The interior side 386 is parallel with the exterior side and the upper retainer surface 316. For illustrative purposes, the router connection panel 302 is shown having a probe area 388 and connection terminals 390 on the interior side 386. The router connection panel 302 can have any number of additional probe areas or any number of the connection terminals 390. For example, the router connection panel 302 can have the probe area 388, the two additional probe areas, and a three more of the connection terminals 390.

The probe area 388 includes the electrical conductors vertically aligned with the some of the lower probe ends 358 facing the interior side 386. The probe area 388 can interconnect more than one of the lower probe ends 358 together based on pre-determined user requirements such as voltage, ground, current, coupling, or noise specifications, using the electrical conductors.

Common rails 392, formed using the electrical conductors, can be used to connect all or portions of the electrical conductors in the probe area 388 to the connection terminals 390. The connection terminals 390, exposed on the interior side 386 or from the exterior side can be used to provide electrical connectivity between the probe area 388 and the next level of integration.

The router connection panel 302 also includes through holes 394 isolated from the common rails 392, the connection terminals 390, and the electrical conductors in and round the probe area 388. The through holes 394 extend through the router connection panel 302.

The through holes 394, orthogonal to the interior side 386, can each be centered under one of the lower probe ends 358. The through holes 394 enable the lower probe ends 358 to contact electrical conductive material exposed on the next level of integration. The lower probe ends 358 to provide connectivity between the integrated circuit device and the next level of integration.

Router alignment holes 396 of the router connection panel 302 can be aligned to the retainer plate 304 in a manner similar to alignment of the bottom alignment holes 324 of the retainer plate 304 to the base plate 306, respectively. The router connection panel 302 is fastened or attached below and in direct contact with the retainer plate 304 with router mount holes 398 in a manner similar to the retainer plate 304, the base plate 306, and the retainer holes 318, respectively, using the removable fasteners 374.

The router mount holes 398 can optionally be internally threaded (not shown) in a manner similar to the retainer holes 318. The removable fasteners 374 can be inserted through the top holes 370, the base holes 338, the retainer holes 318, and into the router alignment holes 396. Threads of the removable fasteners 374 can be mated with the router mount holes 398.

It has been discovered that the removable fasteners 374, the compressible supports 354, the router connection panel 302, the retainer plate 304, the base plate 306, the device plate 308, the post connectors 348, or a combination thereof, can be made and delivered according to customer specifications within days, as opposed to over six weeks, to decrease ramp-up or turn around times for manufacturing, testing, or development of integrated circuit device products.

It has been discovered that the removable fasteners 374, the compressible pins 356 in combination with the pinholes 314, the connector holes 330, and the cavity holes 376 provide improved strength, reliability, or mean time before failure of the router connection panel 302, the retainer plate 304, the base plate 306, and the device plate 308, respectively.

It has been discovered that the removable fasteners 374, the router connection panel 302, the retainer plate 304, the base plate 306, or the device plate 308 can be individually customized to provide a mix and match component system solution that permits full or partial customizable integrated circuit socket systems compatible with different integrated circuit devices including the electrical interconnects of the different integrated circuit devices.

It has been discovered that the router connection panel 302 provides increased signal performance, noise reduction, and routing capability for the next level of integration by the routing of power or grounds through the router connection panel 302 instead of through the next level of integration.

It has been discovered that by the router connection panel 302, the retainer plate 304, the base plate 306, or the device plate 308 can be swapped with another retainer plate, another base plate, or another device plate to accommodate customized integrated circuit packages without the need for a new board or a new socket assembly replacement.

It has been discovered that the post connectors 348, the top alignment holes 368, the post holes 336, the router alignment holes 396, and the bottom alignment holes 324 provide precise alignment and resistance to rotational movement of the router connection panel 302, the retainer plate 304, the base plate 306, or the device plate 308 and can have the pinhole pitch 317 sized between two tenths of a millimeter to one hundred and twenty-seven thousandths of a centimeter.

It has been discovered that the upper ends 350 and the lower ends 352 of the post connectors 348 align and restrict movement between the router connection panel 302, the base plate 306, the retainer plate 304, and the device plate 308 to provide alignment tolerances for the compressible pins 356 and electrical interconnects of an integrated circuit module that are equal to or better than any integrally formed non-serviceable integrated circuit socket.

It has been discovered that applying positive pressure through the pressure port 328 of the retainer plate 304 and the another of the pressure port 328 of the router connection panel 302 removes contaminants or debris before insertion of the integrated circuit module to improve electrical characteristics and reliability between the integrated circuit socket system and the integrated circuit module.

It has been discovered that applying negative pressure through the pressure port 328 of the retainer plate 304 and the another of the pressure port 328 of the router connection panel 302 pulls and holds the an integrated circuit module in the device cavity 366 to improve electrical characteristics between the integrated circuit socket system and the integrated circuit module and to improve reliability by clearing debris or contaminants from the pinholes 314, the connector holes 330, the cavity holes 376, or a combination thereof, for cleaning purposes.

It has been discovered that the removable fasteners 374, the compressible supports 354, the router connection panel 302, the retainer plate 304, the base plate 306, the device plate 308, and the post connectors 348 combined with the compressible pins 356 having a rated lifespan of over one quarter million insertion/compression cycle results in the integrated circuit socket system 300 having a minimum lifespan exceeding one quarter million insertion/removals of an integrated circuit module.

It has been unexpectedly found that the perimeter sides 378 formed at an obtuse angle relative to the upper device surface 372 enable improved automated insertion or removal of integrated circuit modules in to or out of the device cavity 366 for increased hourly unit test throughput.

It has been unexpectedly found that the compressible pins 356 in combination with the pinholes 314, the connector holes 330, and the cavity holes 376 can provide for over two hundred and fifty thousand insertion cycles resulting in a substantially long socket life.

Figure 4:
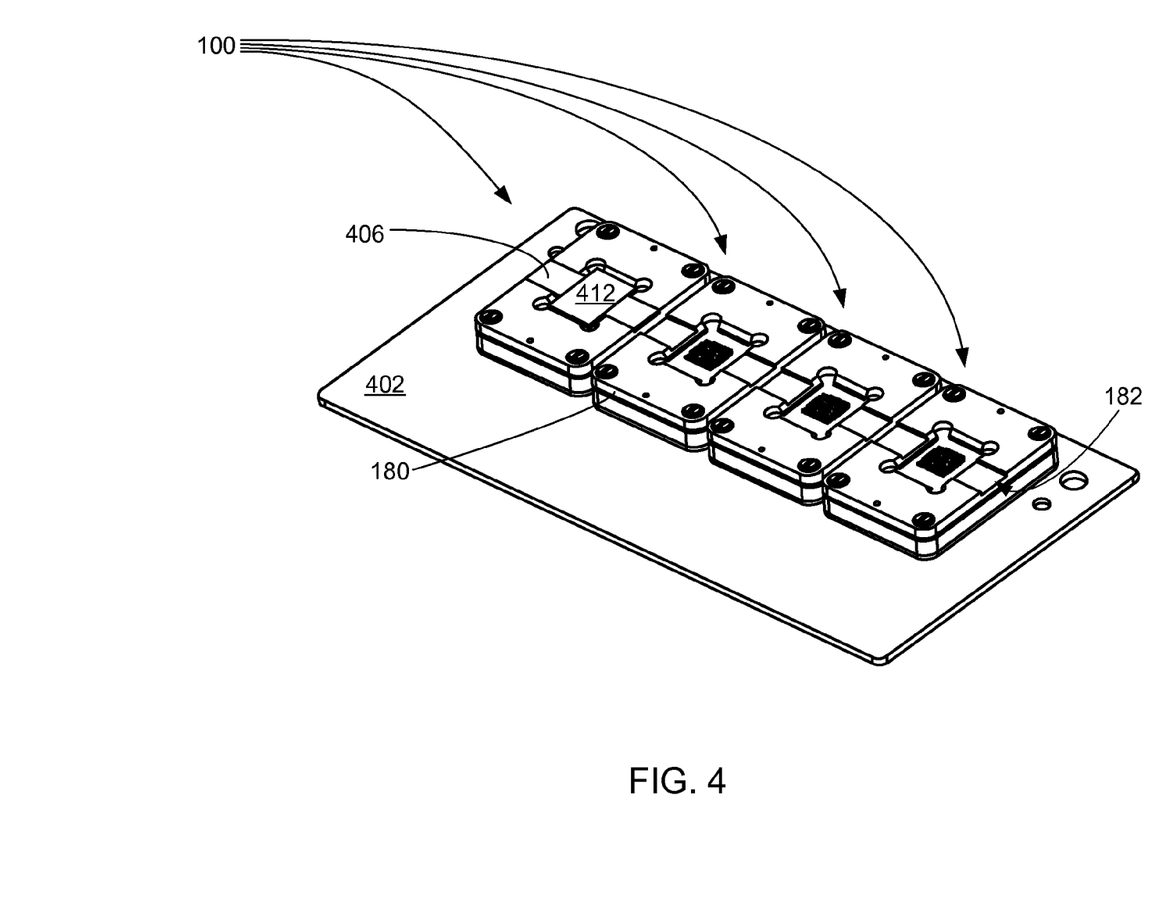
FIG. 4 is the isometric view of the integrated circuit socket system of FIG. 2 in a system integration phase.

Referring now to FIG. 4, therein is shown the isometric view of the integrated circuit socket system 100 of FIG. 2 in a system integration phase. Shown is a plurality of the integrated circuit socket system 100 mounted on a board 402 such as a printed circuit board, board adapter, or any electronic equipment or product. The board 402 can be coupled to or with a part of a next level of electronic integration.

For purposes of illustration, there is a first of the integrated circuit socket system 100, a second of the integrated circuit socket system 100, a third of the integrated circuit socket system 100, and a fourth of the integrated circuit socket system 100 mounted on the board 402. It is understood any number of the integrated circuit socket system 100 can be mounted. For example, the board 402 could have only the second of the integrated circuit socket system 100, the third of the integrated circuit socket system 100, and the fourth of the integrated circuit socket system 100 mounted on the board 402.

The first of the integrated circuit socket system 100 is shown with a retention mechanism including a clip, a fastener, or any other retention device that holds an object in position. For example, the retention mechanism can include retainer clips 406. The first of the integrated circuit socket system 100 is also shown with an integrated circuit module 412 such as the integrated circuit device, an integrated circuit package, or an integrated circuit component. The integrated circuit module 412 having electrical interconnects (not shown) can be inserted into the device cavity 166 of FIG. 1.

The electrical interconnects are aligned with and inserted into the cavity holes 176 of FIG. 1 to contact the upper ends 150 of FIG. 1 of the post connectors 148 of FIG. 1. Insertion of the integrated circuit module 412 into the device cavity 166 results in the lower probe ends 158 either electrically connecting to the router connection panel 302 of FIG. 3 that can be optionally included as described in FIG. 3 or electrically connecting to the board 402 mounted below the plurality of the integrated circuit socket system 100.

The retainer clips 406 can optionally be inserted into portions of the module retention channel 182 intersecting opposing sides of the integrated circuit module 412. The retainer clips 406 have tapered peripheral edges that provide a friction, interlock, or interference fit with the perimeter sides 178 of FIG. 1, the device plate edges 180, and the opposing sides of the integrated circuit module 412 to prevent movement of the integrated circuit module 412. The retainer clips 406 can be inserted or removed.

The retainer clips 406 can be formed of a rigid material. The retainer clips 406 can be formed of metal or plastic. The plastic used for the integrated circuit socket system 100 can be rigid, preferably without plastic deformation. Plastic deformation is defined as deformation applied to a rigid material by loads or forces before a permanent damage or a loss of plasticity occurs that results in a permanent change in a physical property such as a change in shape, strength, or size of the rigid material.

The goal of the retainer clips 406 is to retain the integrated circuit device with enough force to have the integrated circuit device attain proper contact with the compressible pins 356 of FIG. 3. The compliance would come from the integrated circuit device being pushed down on to the compressible pins 356, which can be spring loaded.

It has been discovered that the retainer clips 406 and the portions of the module retention channel 182 intersecting opposing sides of the integrated circuit module 412 provides improved electrical connectivity and vibration immunity between the integrated circuit socket system and the integrated circuit module 412.

It has been discovered that the retainer clips 406 provide improved thermal transfer capacity from the integrated circuit module 412 to the integrated circuit socket system 100.

Figure 5:
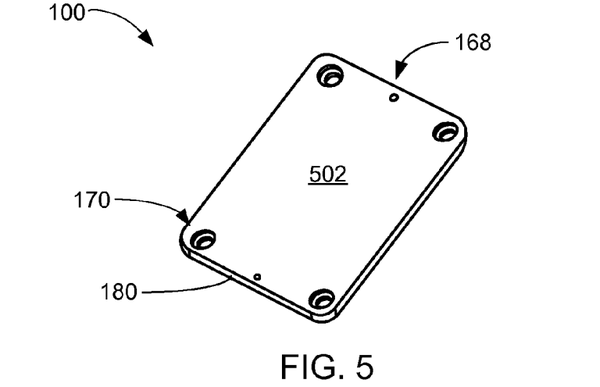
FIG. 5 is an isometric top view of a device plate blank used in the manufacturing of the integrated circuit socket system of FIG. 1 during an initial phase of manufacturing.

Referring now to FIG. 5, therein is shown an isometric top view of a device plate blank 502 used in the manufacturing of the integrated circuit socket system of FIG. 1 during an initial phase of manufacturing. Shown is the device plate blank 502 formed using a machine or mold process.

The device plate blank 502 is formed with having the top holes 170, the top alignment holes 168, and the device plate edges 180 of the device plate 108 of FIG. 1. The device plate blank 502 can be formed into the device plate 108 using a personalization process.

The personalization process includes a material removal process that can include cutting, etching, drilling, sanding, polishing, grinding, planarization, or combinations thereof. The personalization process can include optional visual markings that can include a surface coating, a plating, a text imprint, a symbol imprint, or combinations thereof.

Figure 6:
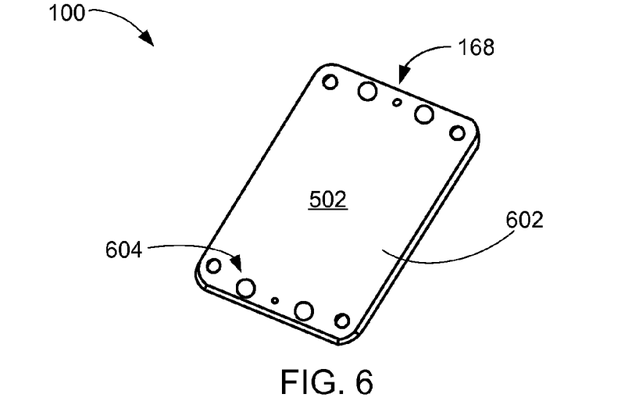
FIG. 6 is an isometric bottom view of FIG. 5 in the pre-processing phase of manufacturing.

Referring now to FIG. 6, therein is shown an isometric bottom view of FIG. 5 in the pre-processing phase of manufacturing. Shown is a lower surface 602 of the device plate blank 502. The lower surface 602 is formed having capture cavities 604 in a manner similar to the retention cavities 134 of FIG. 1.

The capture cavities 604 are formed to have a vertical alignment with the retention cavities 134 during an integration phase that would include vertically aligning the top alignment holes 168 of the device plate blank 502 with the post holes 136 of FIG. 1 while the lower surface 602 is facing the upper base surface 144 of FIG. 1. The capture cavities 604 are used to receive the another end of the compressible supports 154 of FIG. 1.

Figure 7:
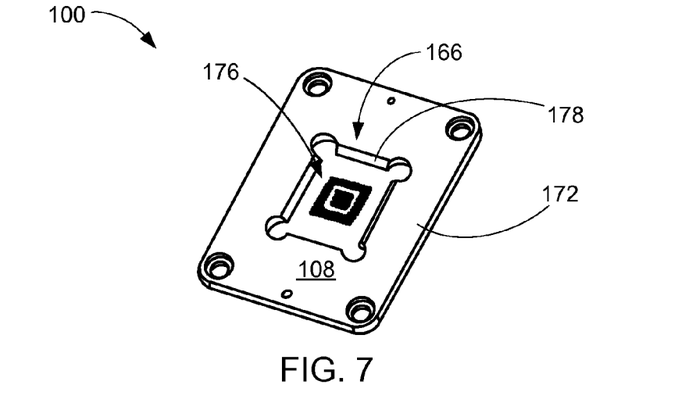
FIG. 7 is the isometric top view of the device plate of FIG. 1 in a forming phase of manufacturing.

Referring now to FIG. 7, therein is shown the isometric top view of the device plate 108 of FIG. 1 in a forming phase of manufacturing. The device plate blank 502 of FIG. 5 can be formed into the device plate 108 having the device cavity 166, the upper device surface 172, the cavity holes 176, and the perimeter sides 178 using user specifications during the personalization process.

The user specifications can include user specified specifications such as cross-sectional and pitch sizes of the cavity holes 176, dimensions of the device cavity 166, shape and profile of the perimeter sides 178, the optional visual markings, or a combination thereof. The upper device surface 172 and the lower surface 602 are planar and parallel with one another.

It has been discovered that the forming of the device plate 108 by customization of the device plate blank 502, in accordance with customer specifications, results in consistency in quality, accuracy, delivery, and repeatability in the production and replication of the device plate 108 due to the usage of the device plate blank 502 as a common base stock.

Figure 8:
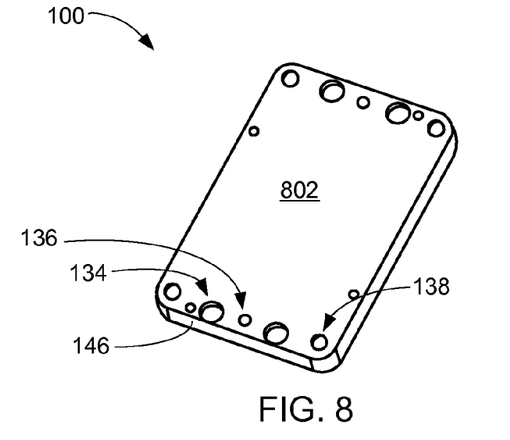
FIG. 8 is an isometric top view of a base plate blank used in the manufacturing of the integrated circuit socket system of FIG. 1 during the initial phase of manufacturing.

Referring now to FIG. 8, therein is shown an isometric top view of a base plate blank 802 used in the manufacturing of the integrated circuit socket system of FIG. 1 during the initial phase of manufacturing. Shown is the base plate blank 802 formed using a machine or mold process.

The base plate blank 802 is formed with having the base plate edges 146, the base holes 138, the post holes 136, and the retention cavities 134 of the base plate 106 of FIG. 1. The base plate blank 802 can be formed into the base plate 106 using the personalization process.

Figure 9:
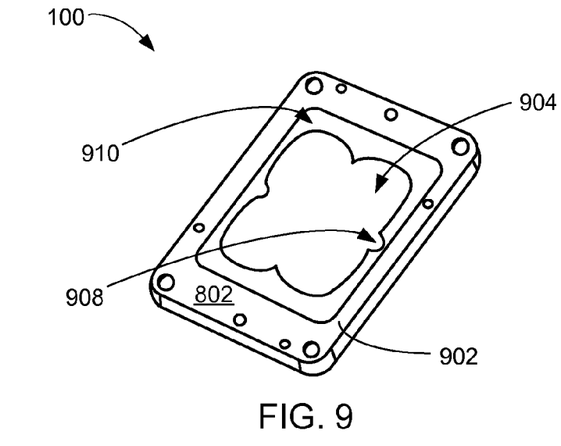
FIG. 9 is an isometric bottom view of FIG. 8 in the pre-processing phase of manufacturing.

Referring now to FIG. 9, therein is shown an isometric bottom view of FIG. 8 in the pre-processing phase of manufacturing. Shown is a lower base surface 902 of the base plate blank 802. The lower base surface 902 is formed having a recess 904 from the lower base surface 902 into a portion of the base plate blank 802.

The recess 904 is formed having a pre-defined planar area determined to be the greater than or equal to a perimeter area used to contain electrical interconnects (not shown) of a user specific integrated circuit module (not shown) such as the integrated circuit device, an integrated circuit package, or an integrated circuit component. The planar area of the recess 904 can be formed having a perimeter outline of any shape.

The recess 904 includes a portion of the perimeter outline having a concave protrusion 908. The recess 904 faces the retainer plate 104 of FIG. 1. The concave protrusion 908 is formed to be vertically aligned over the pressure port 128 of FIG. 1 of the retainer plate 104. The concave protrusion 908 provides a path to the recess 904 for egress or ingress of the gas or the fluid used to clear out debris or contaminants from within or around the integrated circuit socket system 100.

The recess 904 and the concave protrusion 908 can be formed in a retainer recess 910 at the lower base surface 902 of the base plate blank 802. The retainer plate 104 of FIG. 1 can be inserted into the retainer recess 910. The retainer plate 104 can include a flat bottom surface coplanar with the lower base surface 902 resulting in the retainer plate edges 126 of FIG. 1 hidden when the lower base surface 902 is viewed. For illustrative purposes, the retainer plate edges 126 are shown exposed from the integrated circuit socket system 100 as shown in FIG. 2, although it is understood that the retainer plate edges 126 can be hidden as described above.

Also for illustrative purposes, the device plate edges 180 of FIG. 1 are shown exposed from the integrated circuit socket system 100 as shown in FIG. 2, although it is understood that the device plate edges 180 can be hidden. For example, the base plate blank 802 can optionally include a device recess (not shown) at a top side of the base plate blank 802. The device plate 108 of FIG. 1 can include a flat top surface coplanar with a top surface of the base plate blank 802 resulting in the device plate edges 180 hidden when the top side of the base plate blank 802 is viewed.

It has been discovered that the recess 904 with a positive pressure applied through the pressure port 128 aligned to the concave protrusion 908 will clear any debris or contaminants from all of the connector holes 130 of the integrated circuit socket system.

It has been discovered that the recess 904 with a negative pressure applied through the pressure port 128 aligned to the concave protrusion 908 will provide an equally distributed vacuum to all of the connector holes 130 resulting in an equal distribution of retaining force to an integrated circuit module inserted in to the integrated circuit socket system as well as providing improved reliability by clearing debris or contaminants from all the connector holes 130 for cleaning purposes.

It has been discovered that the retainer recess 910 and the device recess provide the benefit of full customization since the retainer recess 910 and the device recess enable the retainer plate 104 and the device plate 108, respectively, to be recessed into the base plate 106 in an unlimited variety of orientations or rotations with respect to one another.

Figure 10:
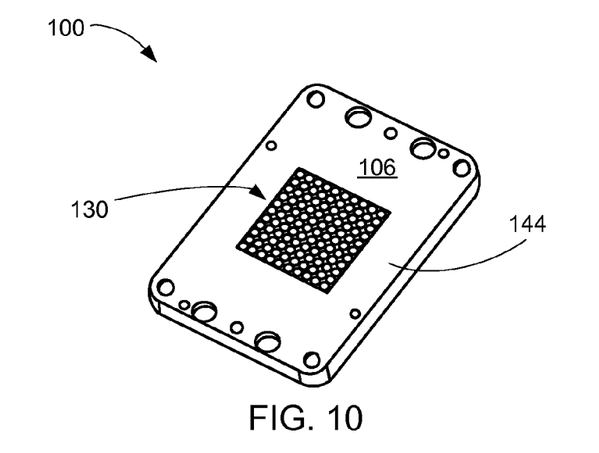
FIG. 10 is the isometric top view of the base plate of FIG. 1 in a forming phase of manufacturing.

Referring now to FIG. 10, therein is shown the isometric top view of the base plate 106 of FIG. 1 in a forming phase of manufacturing. The base plate blank 802 of FIG. 8 can be formed into the base plate 106 having the connector holes 130 using a drilling, laser, or ultrasonic removal process. The connector holes 130 pass through the base plate 106 and the recess 904 of FIG. 9 on the lower base surface 902 of FIG. 9 of the base plate 106 opposite the upper base surface 144.

The connector holes 130 can be made to specifications provided by the user or vendors. For example, sizes, contours, shapes, or a combination thereof, of the connector holes 130 can be made per vendor requirements.

The user specifications can include user specified specifications such as cross-sectional and pitch sizes of the connector holes 130, the optional visual markings, or a combination thereof. The upper base surface 144 and the lower base surface 902 are planar and parallel with one another.

It has been discovered that the forming of the base plate 106 by customization of the base plate blank 802, in accordance with customer specifications, results in consistency in quality, accuracy, delivery, and repeatability in the production and replication of the base plate 106 due to the usage of the base plate blank 802 as a common base stock.

Figure 11:
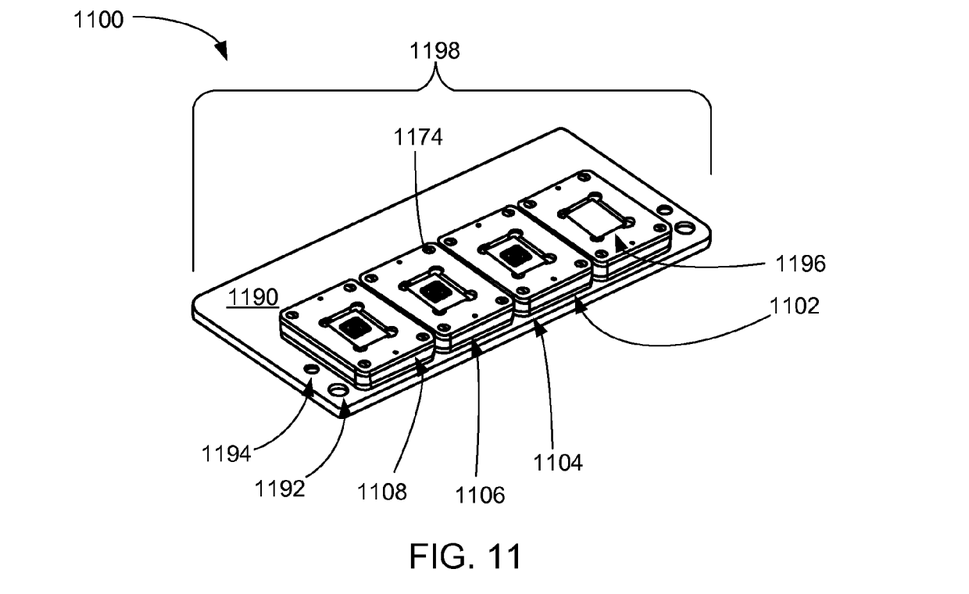
FIG. 11 is an isometric top view of an integrated circuit socket system assembly in another embodiment of the present invention in an assembly phase of manufacturing.

Referring now to FIG. 11, therein is shown an isometric top view of an integrated circuit socket system assembly 1100 in another embodiment of the present invention in an assembly phase of manufacturing. Shown are integrated circuit socket systems 1102, each having a retainer plate 1104, a base plate 1106, a device plate 1108, and removable fasteners 1174 during an assembly phase.

The integrated circuit socket systems 1102, each similar to the integrated circuit socket system 100 of FIG. 1 except the integrated circuit socket systems 1102 include the device plate 1108 formed without the module retention channel 182 of FIG. 1 that is optionally formed on the device plate 108 of FIG. 1 in the integrated circuit socket system 100.

The retainer plate 1104 and the base plate 1106 can be formed in a manner identical to the retainer plate 104 of FIG. 1 and the base plate 106 of FIG. 1 in the integrated circuit socket system 100, respectively. The removable fasteners 1174 can be identical to the removable fasteners 174 of FIG. 1 in the integrated circuit socket system 100.

The integrated circuit socket systems 1102 can be assembled, mounted, and attached directly on a modular board 1190 using the removable fasteners 1174. The modular board 1190, such as a printed circuit board, interposer card, or laminated board, can include through holes 1192 or detents 1194 along opposing edges of the modular board 1190.

The through holes 1192 can extend from a side of the modular board 1190 having the integrated circuit socket systems 1102 to a side of the modular board 1190 facing away from the integrated circuit socket systems 1102. The detents 1194, such as an indentation, a dimple, or a cavity, can be formed from the side of the modular board 1190 having the integrated circuit socket systems 1102 into a portion of the modular board 1190.

The through holes 1192 and the detents 1194 are formed between an edge of the modular board 1190 and one of the integrated circuit socket systems 1102. The through holes 1192 or the detents 1194 can also be formed between another edge of the mother board, opposite the edge of the modular board 1190 and another one or the one of the integrated circuit socket systems 1102.

For illustrative purposes, an integrated circuit component 1196, such as the integrated circuit device or an integrated circuit package, is shown inserted into one of the integrated circuit socket systems 1102. It is understood than any number of the integrated circuit component 1196 can be inserted into one or more of the integrated circuit socket systems 1102. For example, a plurality of the integrated circuit component 1196 can be inserted into each of the integrated circuit socket systems 1102.

The combination of the integrated circuit socket systems 1102 and the modular board 1190 can be referred to as a modular unit 1198. The modular unit 1198 can be further integrated into another level of integration (not shown), such as test equipment, user equipment, user product, or a user specific application requiring at least one of the integrated circuit socket systems 1102.

Figure 12:
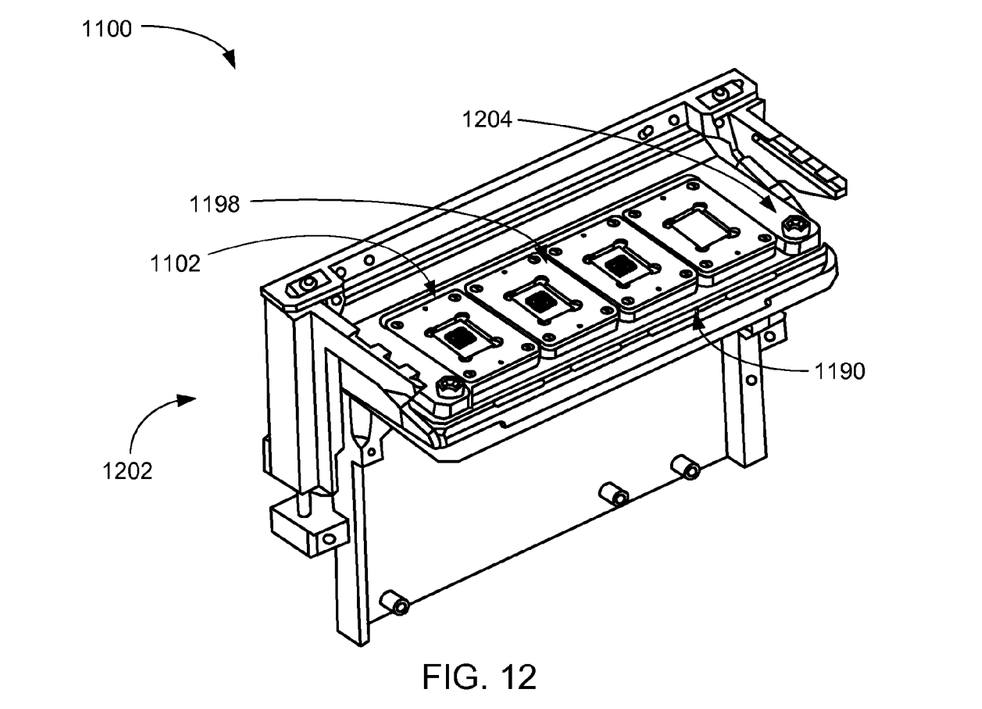
FIG. 12 is an isometric top view of the integrated circuit socket system assembly of FIG. 11 in an integration phase.

Referring now to FIG. 12, therein is shown an isometric top view of the integrated circuit socket system assembly 1100 of FIG. 11 in an integration phase. The modular unit 1198 is inserted and mounted into a card fixture 1202 such as a Data Programmer card assembly, a card slot, or a card connector. The modular unit 1198 can be held, supported, or fastened to the card fixture 1202 using the through holes 1192 of FIG. 11 or the detents 1194 of FIG. 11. The through holes 1192 can be used to retain the modular unit 1198 in the card fixture 1202 using a card fastener 1204 such as a screw, a bolt, or a retainer similar to the removable fasteners 174 of FIG. 1.

It has been discovered that the modular unit 1198 having the integrated circuit socket systems 1102 and the modular board 1190 reduce manufacturing re-tooling change over delays by providing re-configurability of the integrated circuit socket systems 1102 on the modular unit 1198 that is a swappable and portable unit.

Figure 13:
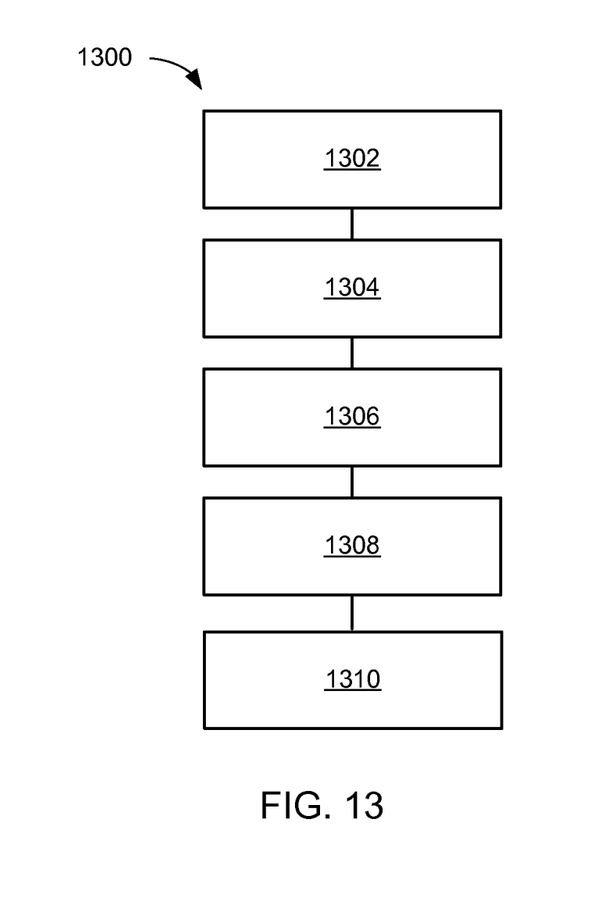
FIG. 13 is a flow chart of a method of manufacture of the integrated circuit socket system in a further embodiment of the present invention.

Referring now to FIG. 13, therein is shown a flow chart of a method 1300 of manufacture of the integrated circuit socket system 100 in a further embodiment of the present invention. The method 1300 includes: forming a retainer plate having a pinhole extending through the retainer plate in a block 1302; forming a base plate having a connector hole extending through the base plate, the connector hole aligned with the pinhole in a block 1304; inserting a compressible pin having a lower probe end through the connector hole and the pinhole below the connector hole, a portion of the compressible pin in the base plate in a block 1306; forming a device plate having a cavity hole extending through the device plate and aligned with the an upper probe end of the compressible pin exposed in the cavity hole in a block 1308; and mounting a removable fastener through the device plate, the base plate, and into the retainer plate, the device plate over the base plate directly on the retainer plate and attached to one another by the removable fastener in a block 1310.

Thus, it has been discovered that the integrated circuit socket system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit socket system comprising:
   forming a retainer plate having a pinhole extending through the retainer plate;
   forming a base plate having a connector hole extending through the base plate, the connector hole aligned with the pinhole;
   inserting a compressible pin having a lower probe end through the connector hole and the pinhole below the connector hole, a portion of the compressible pin in the base plate;
   forming a device plate having a cavity hole extending through the device plate and aligned with an upper probe end of the compressible pin exposed in the cavity hole;
   attaching a router connection panel having a through hole below the retainer plate with the lower probe end extending through the through hole; and
   mounting a removable fastener through the device plate, the base plate, and into the retainer plate, the device plate over the base plate directly on the retainer plate and attached to one another by the removable fastener.

2. The method as claimed in claim 1 further comprising attaching a router connection panel aligned, below, and in direct contact with the retainer plate.

3. The method as claimed in claim 1 further comprising inserting a compressible support exposed between the device plate and the base plate.

4. The method as claimed in claim 1 further comprising inserting a post connector in the base plate, a lower end of the post connector extending into the retainer plate and an upper end extending into the device plate.

5. The method as claimed in claim 1 wherein forming the device plate includes forming the device plate having a device cavity and the device cavity having the cavity hole.

6. A method of manufacture of an integrated circuit socket system comprising:
   forming a retainer plate having a pinhole extending through the retainer plate;
   forming a base plate having a connector hole extending through the base plate, the connector hole aligned with the pinhole;
   inserting a compressible pin having a lower probe end through the connector hole and the pinhole below the connector hole, a portion of the compressible pin in the base plate;
   forming a device plate having a device cavity with a cavity hole extending through the device plate and aligned with an upper probe end of the compressible pin exposed in the cavity hole;
   attaching a router connection panel having a through hole below the retainer plate with the lower probe end extending through the through hole; and
   mounting a removable fastener through the device plate, the base plate, and into the retainer plate, the device plate over the base plate directly on the retainer plate and attached to one another by the removable fastener.

7. The method as claimed in claim 6 further comprising inserting a compressible support to form a compressible gap between the device plate and the base plate exposing the compressible support.

8. The method as claimed in claim 6 wherein forming the base plate having the connector hole includes forming the base plate having the connector hole through a recess of the device plate facing the retainer plate.

9. The method as claimed in claim 6 wherein forming the device plate includes forming a module retention channel between opposing edges of the device plate, the module retention channel intersected and divided by the device cavity.

10. An integrated circuit socket system comprising:
    a retainer plate having a pinhole extending through the retainer plate;
    a base plate having a connector hole extending through the base plate, the connector hole aligned with the pinhole;
    a compressible pin having a lower probe end through the connector hole and the pinhole below the connector hole, a portion of the compressible pin in the base plate;
    a device plate having a cavity hole extending through the device plate and aligned with an upper probe end of the compressible pin exposed in the cavity hole;
    a router connection panel having a through hole below the retainer plate with the lower probe end extending through the through hole; and
    a removable fastener through the device plate, the base plate, and into the retainer plate, the device plate over the base plate directly on the retainer plate and attached to one another by the removable fastener.

11. The system as claimed in claim 10 further comprising a router connection panel attached, aligned, below, and in direct contact with the retainer plate.

12. The system as claimed in claim 10 further comprising a compressible support inserted and exposed between the device plate and the base plate.

13. The system as claimed in claim 10 further comprising a post connector inserted in the base plate, a lower end of the post connector extending into the retainer plate and an upper end extending into the device plate.

14. The system as claimed in claim 10 wherein the device plate includes the device cavity in the device plate having the cavity hole formed in the device cavity.

15. The system as claimed in claim 10 wherein the device plate includes a device cavity formed with the cavity hole.

16. The system as claimed in claim 15 further comprising a compressible support inserted to form a compressible gap between the device plate and the base plate exposing the compressible support.

17. The system as claimed in claim 15 wherein the base plate includes the base plate the connector hole formed through a recess of the device plate facing the retainer plate.

18. The system as claimed in claim 15 wherein the device plate includes forming a module retention channel formed between opposing edges of the device plate, the module retention channel intersected and divided by the device cavity.

* * * * *